US006982495B2

(12) United States Patent
Fröhlich et al.

(10) Patent No.: US 6,982,495 B2
(45) Date of Patent: Jan. 3, 2006

(54) MARK CONFIGURATION, WAFER WITH AT LEAST ONE MARK CONFIGURATION, AND A METHOD OF PRODUCING AT LEAST ONE MARK CONFIGURATION

(75) Inventors: Hans-Georg Fröhlich, Dresden (DE); Johannes Kowalewski, Dresden (DE); Udo Götschkes, Dresden (DE); Frank Hübinger, Dresden (DE); Gerd Krause, Dresden (DE); Heike Langnickel, Wachau (DE); Antje Lässig, Dresden (DE); Reiner Trinowitz, Dresden (DE)

(73) Assignee: Infineon Technologies AG, Munich (DE)

( * ) Notice: Subject to any disclaimer, the term of this patent is extended or adjusted under 35 U.S.C. 154(b) by 309 days.

(21) Appl. No.: 10/284,778

(22) Filed: Oct. 31, 2002

(65) Prior Publication Data

US 2003/0092204 A1 May 15, 2003

(30) Foreign Application Priority Data

Oct. 31, 2001 (DE) ........................................ 101 54 981

(51) Int. Cl.
*H01L 23/544* (2006.01)

(52) U.S. Cl. ....................... 257/797; 438/401; 438/462; 438/975

(58) Field of Classification Search ................. 257/797; 438/401, 462, 975
See application file for complete search history.

(56) References Cited

U.S. PATENT DOCUMENTS

| | | | | | |
|---|---|---|---|---|---|
| 5,925,937 | A | * | 7/1999 | Jost et al. | 257/797 |
| 5,969,428 | A | * | 10/1999 | Nomura et al. | 257/797 |
| 6,046,508 | A | * | 4/2000 | Miyatake | 257/797 |
| 6,140,711 | A | * | 10/2000 | Machida et al. | 257/797 |
| 6,181,018 | B1 | * | 1/2001 | Saino | 257/797 |
| 6,313,542 | B1 | * | 11/2001 | Pramanik et al. | 257/797 |
| 6,440,816 | B1 | * | 8/2002 | Farrow et al. | 438/401 |
| 6,501,189 | B1 | * | 12/2002 | Kim et al. | 257/797 |
| 6,617,702 | B2 | * | 9/2003 | Hsu et al. | 257/797 |
| 6,635,567 | B2 | | 10/2003 | Ebertseder et al. | |

FOREIGN PATENT DOCUMENTS

| | | |
|---|---|---|
| DE | 100 00 759 C1 | 5/2001 |
| DE | 100 46 925 A1 | 8/2001 |

* cited by examiner

*Primary Examiner*—Van Thu Nguyen
*Assistant Examiner*—Douglas Menz
(74) *Attorney, Agent, or Firm*—Laurence A. Greenberg; Werner H. Stemer; Ralph E. Locher

(57) ABSTRACT

A mark configuration for the alignment and/or determination of a relative position of at least two planes in relation to one another in a substrate and/or in layers on a substrate during lithographic exposure, in particular, in the case of a wafer during the production of DRAMs, includes a mark structure, and at least one layer of a definable thickness underneath the mark structure for adjusting the physical position of the mark structure relative to a reference plane in or on the substrate. Also provided is a wafer having such a configuration and a process for providing such a configuration. The invention allows a mark configuration to have mark structures exhibiting good contrast regardless of the design or the process conditions.

14 Claims, 2 Drawing Sheets

MARK CONFIGURATION, WAFER WITH AT LEAST ONE MARK CONFIGURATION, AND A METHOD OF PRODUCING AT LEAST ONE MARK CONFIGURATION

BACKGROUND OF THE INVENTION

Field of the Invention

The invention relates to a mark configuration for the alignment and/or determination of the relative position of at least two planes in relation to one another in a substrate and/or in layers on a substrate during lithographic exposure, in particular, in the case of a wafer during the production of DRAMs, a wafer with at least one such mark configuration, and a method of producing such a mark configuration.

During the production of semiconductor components, structures are formed in various planes, which are applied one after another to a substrate and, then, in each case changed by further processing steps. These processing steps include, for example, deposition, photomasking, lacquer development, lacquer structuring, and etching steps.

As a result of the increasingly smaller dimensions of the structures, it is necessary to align sequentially applied layers exactly with one another because, otherwise, the function of the semiconductor components is not ensured.

The production of the structures is carried out with an exposure tool, the exposure acting on a photosensitive lacquer (photoresist) that is applied to the substrate (e.g., wafer). Such a substrate is loaded into the exposure tool. By using alignment marks on the substrate, the exposure tool recognizes defined positions. Base upon the values determined by the alignment marks, the substrate is aligned and exposed, and, in such a case, overlay targets (overlay measurement structures) are printed at the same time, permitting position determination.

One possible way of detecting the position of at least two planes lies in optical evaluation of the marks (overlay targets, alignment marks) on and/or in the relevant planes. For such a purpose, monochromatic or white light is radiated onto the substrate, and the reflected light is evaluated, for example, by image recognition. The efficiency of the evaluation in such a case depends on the differences in contrast in the image. Here, the contrast is defined as the ratio between the difference between the maximum and the minimum intensity and the sum of the maximum and minimum intensities.

The differences in contrast on the substrate are often produced by step heights (for example, of a trench in the substrate surface) of mark structure and surroundings. The setting of the step heights here depends to a great extent on the design of the semiconductor component. For reliable detection of the mark structure, sharply defined edges of the step are necessary. However, the step edges of the mark structures cannot be chosen such that such edges can be registered optimally by optical methods because process parameters, such as layer thicknesses and etching times, are predefined by the design. The steps are, therefore, either too flat or too deep in order to exhibit a good difference in contrast in many cases.

SUMMARY OF THE INVENTION

It is accordingly an object of the invention to provide a mark configuration, wafer with at least one mark configuration, and a method of producing at least one mark configuration that overcome the hereinafore-mentioned disadvantages of the heretofore-known devices and methods of this general type and that exhibit good contrast of the mark structures, regardless of the design or the process conditions.

With the foregoing and other objects in view, there is provided, in accordance with the invention, a mark configuration for at least one of alignment and determination of a relative position of at least two planes in relation to one another in at least one of a substrate and layers on the substrate during lithographic exposure, including a substrate having a reference plane at least one of therein and thereon, a mark structure disposed at the substrate, and at least one layer having a defined thickness disposed between the mark structure and the substrate adjusting a physical position of the mark structure relative to the reference plane.

As a result of the introduction of at least one layer of definable thickness underneath the mark structure, the physical position of the mark structure relative to a reference plane in/or on the substrate can be adjusted. By changing the physical position, the difference in contrast can be changed in the desired manner to make detection easier during optical evaluation of the mark structure.

In such a case, in accordance with another feature of the invention, it is advantageous if the reference plane is a plane on or at which a measurement on the mark structure can be performed. As a result, optical evaluation is, in particular, made easier.

It is also advantageous if, in accordance with a further feature of the invention, by the layer of definable thickness, adjustment of the physical position of the mark structure at right angles or orthogonal to the reference plane, for example, in the form of steps, is carried out. Such an adjustment can easily be verified optically and can be produced relatively easily.

In accordance with an added feature of the invention, it is advantageous if the mark structure has at least one trench in or on the surface or reference plane and/or at least one elevation on or at the surface or reference plane.

In accordance with an additional feature of the invention, the at least one layer of definable thickness is configured as an etch stop. As a result of introducing the etch stop, the layer of the mark structure can be adjusted accurately, in particular, irrespective of fluctuations in the process conditions (for example, concentration of etching gas).

In accordance with yet another feature of the invention, it is also advantageous if the at least one layer of definable thickness is formed as a metal layer, in particular, of tungsten.

With the objects of the invention in view, there is also provided a mark configuration for at least one of alignment and determination of a relative position of at least two planes in relation to one another in at least one of a wafer and layers on the wafer during production of DRAMs, including a wafer having a reference plane at least one of therein and thereon, a mark structure disposed at the wafer, and at least one layer having a defined thickness disposed between the mark structure and the wafer adjusting a physical position of the mark structure relative to the reference plane.

With the objects of the invention in view, there is also provided a wafer, including a substrate, a reference plane, and a mark configuration at least one of aligning and determining a relative position of at least two planes in relation to one another in the wafer during production of DRAMs, the mark configuration having a mark structure and at least one layer having a defined thickness disposed between the mark structure and the substrate adjusting a physical position of the mark structure relative to the reference plane.

With the objects of the invention in view, there is also provided a wafer, including a substrate, a reference plane, and a mark configuration at least one of aligning and determining a relative position of at least two planes in relation to one another in the wafer, the mark configuration having a mark structure and at least one layer having a defined thickness disposed between the mark structure and the substrate adjusting a physical position of the mark structure relative to the reference plane.

With the objects of the invention in view, there is also provided a method of producing a mark configuration, including the steps of applying at least one layer having a defined thickness to a substrate underneath an area in which a mark structure is to be disposed, and subsequently providing a mark structure on the substrate.

In the method of producing a mark configuration of the invention, at least one layer of definable thickness is applied to a substrate underneath the area in which a mark structure is to be disposed, and, then, a mark structure is disposed on the substrate.

In accordance with yet a further mode of the invention, a relative position of at least two planes in relation to one another is aligned and/or determined in at least one of the substrate and layers on the substrate during lithographic exposure with the mark structure.

In accordance with a concomitant mode of the invention, a reference plane is defined at the substrate and a physical position of the mark structure is adjusted relative to the reference plane with the layer disposed between the mark structure and the substrate.

Other features that are considered as characteristic for the invention are set forth in the appended claims.

Although the invention is illustrated and described herein as embodied in a mark configuration, wafer with at least one mark configuration, and a method of producing at least one mark configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
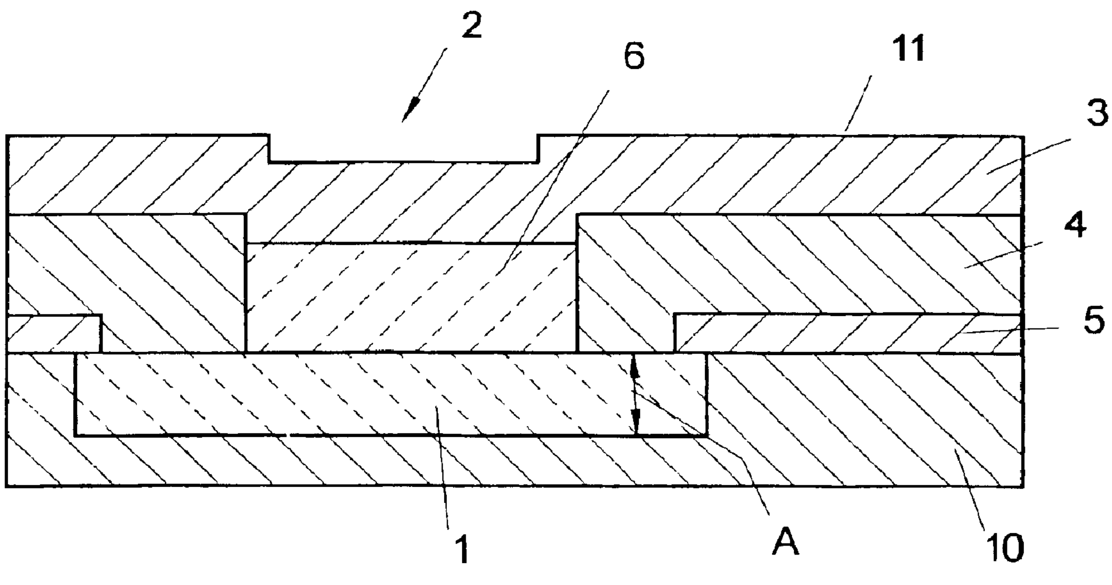
FIG. 1 is a fragmentary, cross-sectional view of a mark configuration according to the invention.

Referring now to the figures of the drawings in detail and first, particularly to FIG. 1 thereof, there is shown a detail of an embodiment of a mark configuration according to the invention. Here, as a mark structure 2, there is a trench extending vertically in the direction of the substrate 10 from a surface 11 of a metal layer 3. Here, the trench 2 is part of an overlay target in the first metal layer 3. The width of the trench, here, is about 2 μm.

The lateral steps of the trench 2 produce the difference in contrast required for optical detection during optical examination of the surface 11.

The surface 11, here, is the plane (surface) on which optical measurements are made on the mark structure 2, in order, for example, to determine the position of the wafer during a processing step. The surface 11 is used subsequently as a reference plane 11 for the definition of the following layers in connection with the invention.

In principle, however, another, deeper layer can also have a surface that can serve as a reference plane 11.

According to the invention, the mark configuration has a layer 1 of definable thickness A underneath the mark structure 2. The layer 1 is somewhat wider in terms of horizontal extent than the trench 2, about 4 μm here.

The layer 1 is, here, formed of tungsten and serves as an etch stop. Because the layer 1 is additionally applied in a previous plane, the step height of the trench 2 can be adjusted irrespective of other process parameters. Through the step height, the contrast of the trench 2 as part of the mark structure can, then, be adjusted.

Above the layer 1 of definable thickness A, a tungsten layer 6 is disposed underneath the trench 2.

The invention will be described using the example of adjusting the contrast step for a trench 2.

Alternatively, the layer 1 of definable thickness A can also be used in conjunction with an elevation as part of a mark structure 2. In a previous plane, the layer 1 of definable thickness A is, then, applied underneath the elevation to define the lateral step height of the elevation with respect to the surface 11. The layer 1 of definable thickness A can also be applied to mark structures 2 that have trenches and elevations. The adjustment of the step height proceeds in a manner analogous to that described.

In addition, it is, in principle, possible to use a plurality of layers 1 of definable thickness A or tungsten layers 6 to obtain further degrees of freedom in configuring the mark structures.

Figure 3A:
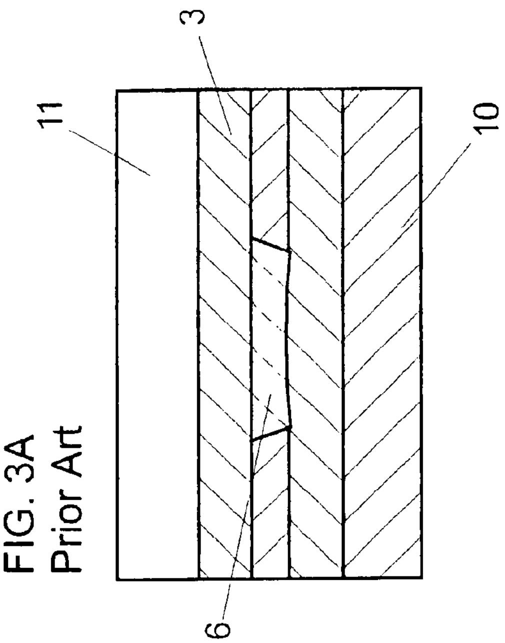
FIG. 3A is a fragmentary, cross-sectional view of a tracing of a recording of a prior art mark configuration with too high a step height.
Figure 3B:
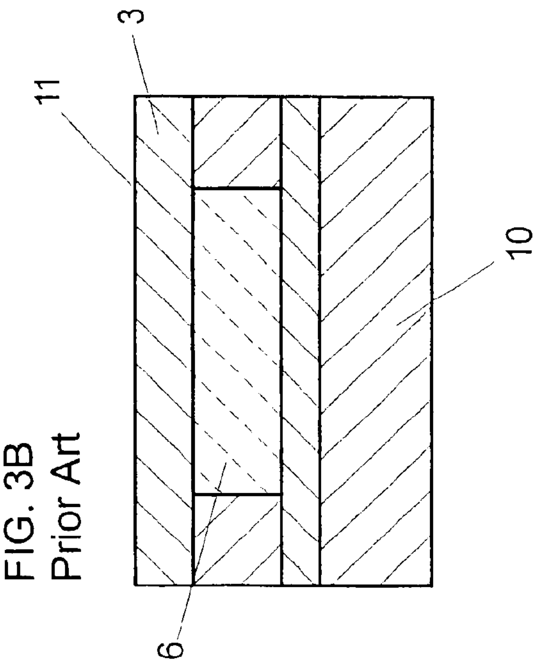
FIG. 3B is a fragmentary, cross-sectional view of the prior art mark configuration of FIG. 3A.
Figure 2A:
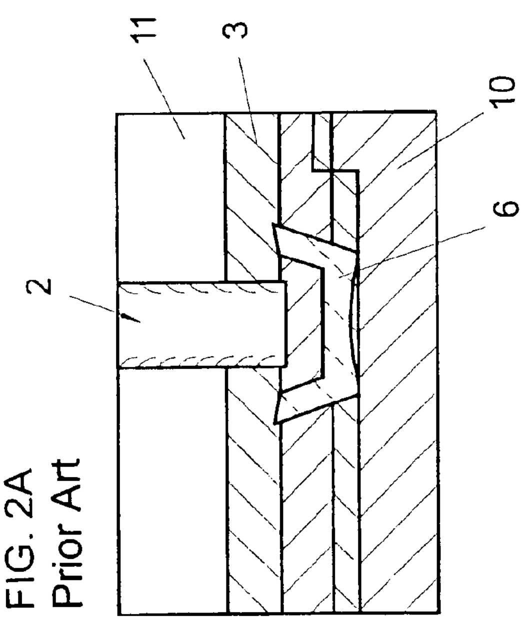
FIG. 2A is a fragmentary, cross-sectional view of a tracing of a recording of a prior art mark configuration with too flat a step height.

By using FIGS. 2A to 3B, it is intended to illustrate examples of problems to be solved by the layer 1 of definable thickness previously presented. FIGS. 2A and 3A show tracings of electron-microscope images of parts of a mark structure. FIGS. 2B and 3B, in each, case show sectional views relating to these. The reference symbols in this case correspond to those of FIG. 1.

Figure 2B:
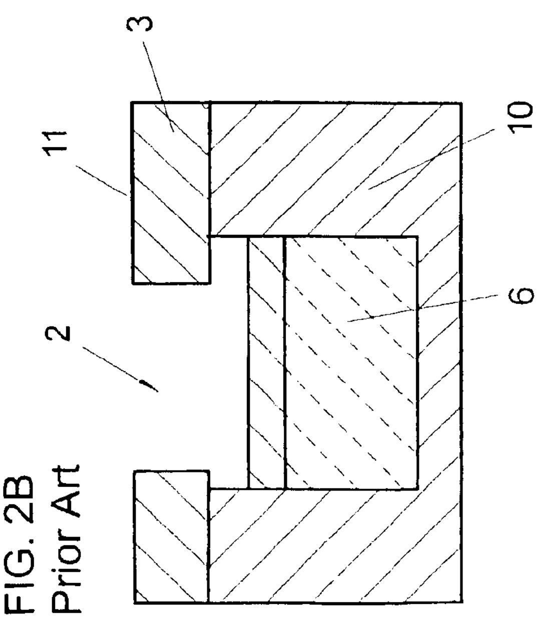
FIG. 2B is a fragmentary, cross-sectional view of the prior art mark configuration of FIG. 2A.

In FIGS. 2A and 2B, it is possible to see a trench 2 belonging to the mark structure but which, because of the process conditions, has become too deep. It has transpired that such a deep trench 2 does not result in a good defined difference in contrast during the measurement. Instead, fluctuations in light and scattered light interfere.

In FIGS. 3A and 3B, the trench has barely been formed, because of the process conditions so that no adequate difference in contrast is obtained here either.

The examples show that it is necessary to produce exactly definable trench depths in order to produce a good difference in contrast, as was explained in connection with FIG. 1.

The invention is not restricted in terms of its implementation to the preferred exemplary embodiments specified above. Rather, a number of variants are conceivable which make use of the mark configuration according to the invention, a wafer with the mark configuration or the method of producing the mark configuration, even in fundamentally different types of embodiment.

We claim:

1. A mark configuration for at least one of alignment and determination of a relative position of at least two planes in relation to one another in at least one of a substrate and layers on the substrate during lithographic exposure, comprising:

a substrate having a reference plane at least one of therein and thereon;

a mark structure disposed at said substrate; and at least one layer having a defined thickness disposed between said mark structure and said substrate adjusting a physical position of said mark structure relative to said reference plane.

2. The mark configuration according to claim 1, wherein said reference plane is a plane on which a measurement can be made on said mark structure.

3. The mark configuration according to claim 1, wherein said reference plane is a plane at which a measurement can be made on said mark structure.

4. The mark configuration according to claim 1, wherein said layer adjusts a physical position of said mark structure at right angles to said reference plane.

5. The mark configuration according to claim 1, wherein said layer adjusts a physical position of said mark structure orthogonal to said reference plane.

6. The mark configuration according to claim 1, wherein said mark structure has at least one trench in said reference plane.

7. The mark configuration according to claim 1, wherein said mark structure has at least one elevation on said reference plane.

8. The mark configuration according to claim 1, wherein said mark structure has at least one elevation at said reference plane.

9. The mark configuration according to claim 1, wherein said layer is an etch stop.

10. The mark configuration according to claim 1, wherein said layer is a metal layer.

11. The mark configuration according to claim 10, wherein said metal layer is of tungsten.

12. A mark configuration for at least one of alignment and determination of a relative position of at least two planes in relation to one another in at least one of a wafer and layers on the wafer during production of DRAMs, comprising:

a wafer having a reference plane at least one of therein and thereon;

a mark structure disposed at said wafer; and at least one layer having a defined thickness disposed between said mark structure and said wafer adjusting a physical position of said mark structure relative to said reference plane.

13. A wafer, comprising:

a substrate;

a reference plane; and a mark configuration at least one of aligning and determining a relative position of at least two planes in relation to one another in the wafer during production of DRAMs, said mark configuration having:

a mark structure; and at least one layer having a defined thickness disposed between said mark structure and said substrate adjusting a physical position of said mark structure relative to said reference plane.

14. A wafer, comprising:

a substrate;

a reference plane; and a mark configuration at least one of aligning and determining a relative position of at least two planes in relation to one another in the wafer, said mark configuration having:

a mark structure; and at least one layer having a defined thickness disposed between said mark structure and said substrate adjusting a physical position of said mark structure relative to said reference plane.

* * * * *